United States Patent [19]

Fink et al.

[11] Patent Number: 4,919,780
[45] Date of Patent: Apr. 24, 1990

[54] METHOD OF MAKING SELF-ALIGNED APERTURES

[75] Inventors: Hans-Werner Fink, Gattikon; Roger Morin, Marseille; Heinz Schmid, Oberrieden; Werner Stocker, Wadenswil, all of Switzerland

[73] Assignee: International Business Machines Corporation, Armonk, N.Y.

[21] Appl. No.: 333,386

[22] Filed: Apr. 3, 1989

[30] Foreign Application Priority Data

Jul. 22, 1988 [EP] European Pat. Off. ........ 88111803.8

[51] Int. Cl.⁵ .............................................. B23K 28/00
[52] U.S. Cl. ................................ 204/192.34; 156/643
[58] Field of Search ..................... 204/192.34; 156/643

[56] References Cited

FOREIGN PATENT DOCUMENTS

82/02979 9/1982 PCT Int'l Appl. .

OTHER PUBLICATIONS

Fink, H. W. "Mono—Atomic Tips For Scanning Tunneling Microscopy." *IBM J. Res. and Dev.*, vol. 30, No. 5, 1986, pp. 460–465.

Binnig, G. K., et al. "Sputter Tip." *IBM Technical Disclosure Bulletin*, vol. 27, No. 8, Jan. 1985, p. 4890.

Asayag, G. B. et al. "Close-Spaced Ion Emission from Gold and Gallium Liquid Metal Ion Source." *Surface Science*, vol. 181, 1988, pp. 362–369.

*Primary Examiner*—G. L. Kaplan
*Attorney, Agent, or Firm*—Marc D. Schechter

[57] ABSTRACT

A method for fabricating exactly aligned apertures for use in electron and ion microscopy involves the placing of a very sharply pointed tip (1) in front of a set of extremely thin, precisely spaced metal foils (3,5) in an atmosphere of heavy gas atoms. The application of an elevated voltage at the tip (1) will result in a sputtering operation to commence and erode the metal foils (3,5) at a location underneath the facing tip (1). The sputtering operation is continued until the first ions are detected to emerge on the far side of the lens structure (2).

11 Claims, 1 Drawing Sheet

METHOD OF MAKING SELF-ALIGNED APERTURES

BACKGROUND OF THE INVENTION

This invention relates to a stack of well-aligned small holes to be used in ion and electron microscopy, and in particular to a method for fabricating apertures making up a lens system.

One of the problems in ion or electron microscopy is the alignment of the ion or electron source with the apertures of the lens system, considering the fact that the dimensions of the sources as well as those of the lenses are extremely small.

An obvious and generally practiced method in the fabrication of lenses, though with a much larger inner diameter, involves the electron-optical machining and simultaneous observation of the alignment process. This method is, however, not applicable in the manufacture of apertures having a diameter in the nanometer range.

SUMMARY OF THE INVENTION

It is an object of the invention to propose a method for fabricating exactly aligned apertures for use in ion and electron microscopy.

It is another object of the present invention to provide a method for fabricating holes in the nanometer range to form apertures that allow higher resolution to be achieved with electron or ion microscopes.

It is a further object of the invention to provide a method for fabricating a lens system, for use in electron or ion microscopy, for example, which lens system comprises at least two apertures with exact mutual alignment and at closely controlled distance.

These objects are achieved by the method of the invention involving the in-situ sputtering of precisely aligned apertures into a set of spaced-apart metal foils by means of a sharply pointed tip serving as an ion source.

In accordance with the invention, a small aperture can be fabricated by "drilling" a small hole into a very thin metal foil. The foil has to be thin in order to avoid undesired refraction and reflections of the electron (or ion) beam inside the hole. Thus, the thickness of the metal foil is chosen to be on the order of micrometers.

In connection with beams of electrons or ions, 'small hole' means a hole with a diameter on the order of tens of nanometers. Drilling a hole of that size is, of course, not possible with conventional means.

In accordance with the present invention, a method for making self-aligned apertures in a lens structure for use in ion or electron microscopy is characterized by the steps of placing a sharply pointed electrically conductive tip in front of a set of metal foils held in a parallel arrangement at a distance determined by a plurality of insulating media, bombarding said foils with heavy ions at a narrowly confined area thereof, sputtering holes through said foils, monitoring the arrival of the first ions passing through said holes by detector means arranged on the side of said lens structure facing away from said tip, and terminating the sputtering operation upon the arrival of the first ions at said detector means.

DESCRIPTION OF THE PREFERRED EMBODIMENTS

In accordance with the invention, the 'drilling' of the hole into a metal foil is done by sputtering, i.e. removal of atoms from the metal foil at a very narrowly defined location thereof until the hole of the desired diameter is created. As is well known to those skilled in the art, the term 'sputtering' describes the disintegration of a metal cathode when the cathode is bombarded with positive ions. The metal atoms get excited to such an extent that the binding energy to their neighbours is surpassed, and they are ejected from the surface in varous directions against the forces of cohesion.

Since the desired diameter of the aperture to be fabricated is so small, it is necessary to confine the area of the sputtering operation accordingly. In accordance with the invention, this is accomplished by using as the sputter anode a tip as sharply pointed as possible. Theoretically, the sharpest possible tip has but a single atom at its apex. Tips of that quality can actually be manufactured!

A straightforward way to build up stable single atom tips is described by H.-W. Fink in "Mono-atomic tips for scanning tunneling microscopy", *IBM Journal of Research and Development*, Vol. 30, No. 5, 1986, pp. 460–465. In essence, single tungsten atom is placed by field-ion microscopy techniques onto the very end of a sharply pointed tungsten tip. The apex of the tip is represented by a trimer of tungsten atoms on a (111) plane.

Figure 1:
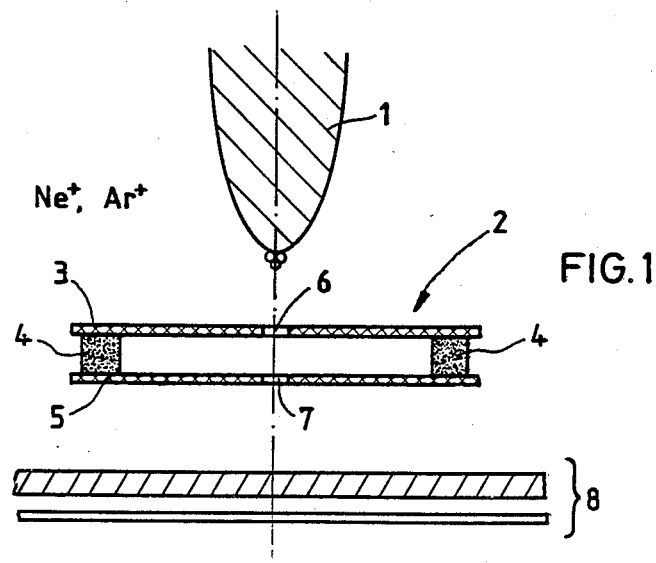
FIG. 1 is a cross-sectional view of an apparatus for manufacturing an ion or electron lens in which a sharp tip is placed above the lens structure being manufactured.

As shown in FIG. 1, a monoatomic tip 1 is placed above a lens structure 2 comprising a first metal foil 3 which will later become the entrance aperture, a plurality of insulating spacers 4 and a second metal foil 5 which will become the exit aperture of lens structure 2. In an argon or neon atmosphere, monoatomic tip 1 emits argon or neon ions with an angular divergence of about 0.5° from the normal. The size of the hole produced by sputtering depends on the distance between tip 1 and first metal foil 3. At a distance of 1 micrometer, for example, a hole with a diameter of about 18 nm will be produced.

An estimate of the sputtering time required fin the process can be made for drilling a hole of 1 $\mu m^2$ into a copper foil of 1 $\mu m$ thickness in an atmosphere of argon. With a tip-to-foil distance of about 120 $\mu m$ for a monoatomictip, or of about 60 $\mu m$ for a tip ending in a trimer, and with a tip voltage of about 1 kV, an ion current of about 1 pA will result. The ensuring sputtering yield will be on the order of three copper atoms for each incident argon ion. Then the sputtering time will be around one hour.

The spacers 4 may consist of piezoelectric elements having appropriate connections to controlled voltage sources so as to permit adjustment of the distance between foils 3 and 5 should this become necessary owing to thermal drift.

The hole created is a magnified image of the tip, more particularly of the upper terrace of the tip. In the case of a monoatomic tip, the shape of the hole created will be essentially circular, in the case of a tip terminating in a trimer of atoms, for example, the hole created will be essentially triangular.

After the hole 6 in first metal foil 3 is produced, the sputtering operation is continued to produce a hole 7 in foil 5. Since neither tip 1 nor lens structure 2 have been moved, holes 6 and 7 will be exactly aligned.

On the side of lens structure 2 away from tip 1 there is arranged a channelplate detector 8 serving to detect the ions passing through lens structure 2 as hole 7 is open. The sputtering operation is terminated as soon as the first ions arrive at channelplate detector 8.

Figure 2:
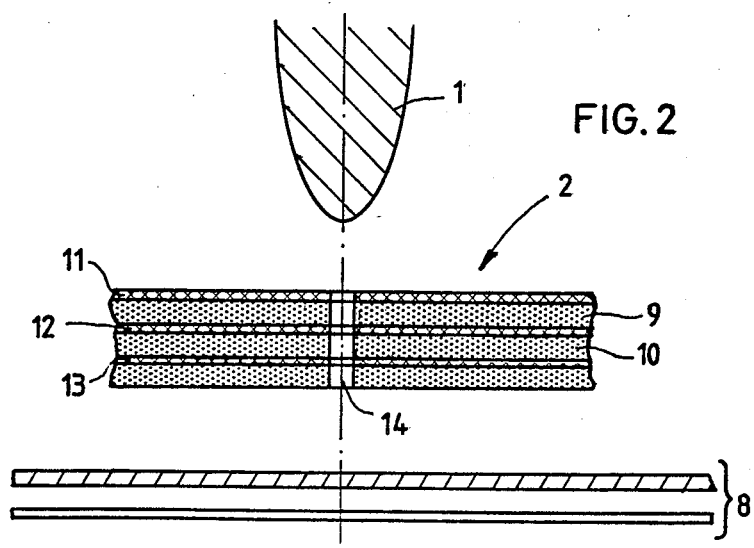
FIG. 2 is a cross-sectional view of an alternative embodiment of the lens structure being manufactured.

FIG. 2 shows an alternative embodiment where the spacers 4 of FIG. 1 are replaced by thin insulating films 9 and 10 separating metal foils 11, 12, and 13. Of course, the sputtering operation will result in a hole 14 extending all the way through metal foils 11, 12, and 13 as well as through the separating films 9 and 10.

The arrangement comprising tip 1 and lens structure 2 may be used as an imaging system in which the heavy argon or neon atoms are replaced by helium, and where a macroscopic sample is substituted for the channelplate detector 6, be it at a different distance. Lens structure 2 then serves to projet an image of tip 1 onto that distant sample.

We claim:

1. Method for making self-aligned apertures in a lens structure (2) for use in ion or electron microscopy, characterized by the steps of placing a sharply pointed electrically conductive tip (1) in front of said lens structure (2) consisting at least of first and second metal foils (3, 5; 11 . . . 13) held in a parallel arrangement at a distance determined by a plurality of insulating media (4; 9, 10), said tip having a surface and an apex on the surface of the tip, said apex being located at a point on the surface of the tip which is closest to the metal foils, said tip having from one to three atoms on the surface of the tip at the apex of the tip, bombarding said foils (3, 5; 11 . . . 13) with heavy ions at a narrowly confined area thereof, sputtering holes (6, 7; 14) through said foils (3, 5; 11 . . . 13), monitoring the arrival of the first ions passing through said holes (6, 7; 14) by detector means (8) arranged on the side of said lens structure (2) facing away from said tip (1), and terminating the sputtering operation upon the arrival of the first ions at said detector means (6).

2. Method in accordance with claim 1, characterized in that a tungsten tip (1) is used having a single tungsten atom adsorbed at its apex.

3. Method in accordance with claim 2, characterized in that said tip (1) is placed above the surface of the uppermost foil (3; 11) of said lens system (2) at a distance of about 120 $\mu$m, and that the tip voltage is on the order of 1 kV.

4. Method in accordance with claim 1, characterized in that a tungsten tip (1) is used having trimer of tungsten atoms at its apex.

5. Method in accordance with claim 4, characterized in that said tip (1) is placed above the surface of the uppermost foil (3; 11) of said lens system (2) at a distance of about 60 $\mu$m, and that the tip voltage is on the order of 1 kV.

6. Method in accordance with claim 1, characterized in that said tip (1) is placed for sputtering at a distance greater than or equal to 1 $\mu$m from the uppermost foil (3; 11) of said lens structure (2).

7. Method in accordance with claim 1, characterized in that the distance between said foils (3, 5; 11 . . . 13) is determined by the thickness of insulating media (4; 9, 10) separating said foils (3, 5; 11 . . . 13).

8. Method in accordance with claim 7, characterized in that said insulating media (4) separating said foils (3, 5) are of annular form and consist of piezoelectric material.

9. Method in accordance with claim 7, characterized in that said insulating media separating said foils (11 . . . 13) consist of thin films (9, 10) of dielectric material.

10. A method of making self-aligned apertures in a lens structure for use in ion or electron microscopy, said method comprising the steps of:
providing a lens-blank structure comprising at least first and second substantially parallel metal foils spaced apart by electrically insulating means;
placing a sharply pointed electrically conductive tip on a first side of the first metal foil, said tip having a surface and an apex on the surface of the tip, said apex being located at a point on the surface of the tip which is closest to the metal foils, said tip having from one to three atoms on the surface of the tip at the apex of the tip;
providing a source of gaseous heavy atoms between the lens-blank structure and the tip;
providing an electric potential between the electrically conductive tip and the lens-blank structure so as to generate a narrow beam of heavy ions incident on the lens-blank structure;
sputtering holes through the lens-blank structure with the beam of heavy ions;
monitoring the arrival of the first ions passing through said holes by detector means arranged on the side of said lens structure facing away from said tip; and
terminating the sputtering operation upon the arrival of the first ions at said detector means.

11. A method as claimed in claim 10, characterized in that the apex of the tip is spaced from the metal foils by at least one micron.

* * * * *